United States Patent [19]
Pugel et al.

[11] Patent Number: 5,654,774
[45] Date of Patent: Aug. 5, 1997

[54] TUNER FOR DIGITAL SATELLITE RECEIVER

[75] Inventors: Michael Anthony Pugel, Nobelsville; Kurt Joseph Richter, Carmel, both of Ind.

[73] Assignee: Thomson Consumer Electronics, Inc., Indianapolis, Ind.

[21] Appl. No.: 467,097

[22] Filed: Jun. 6, 1995

[51] Int. Cl.⁶ .................................................. H04N 5/44
[52] U.S. Cl. ................. 348/725; 348/736; 455/3.2; 455/131; 455/190.1; 375/348
[58] Field of Search ................. 348/725, 731, 348/735, 736, 737; 455/3.2, 131, 180.3, 190.1, 197.1; 375/348, 350; H04N 5/44

[56] References Cited

U.S. PATENT DOCUMENTS

| | | | |
|---|---|---|---|
| 4,223,285 | 9/1980 | Hazama et al. | 333/194 |
| 4,599,652 | 7/1986 | Carlson | 348/735 |
| 4,829,273 | 5/1989 | Nozaki et al. | 333/194 |
| 5,068,918 | 11/1991 | Verheijen et al. | 348/731 |
| 5,134,707 | 7/1992 | Sakashi et al. | 455/3.2 |
| 5,331,247 | 7/1994 | Ikeda et al. | 310/313 |
| 5,428,814 | 6/1995 | Mort et al. | 455/12.1 |
| 5,479,453 | 12/1995 | Anvari et al. | 375/348 |

OTHER PUBLICATIONS

"Digital Communication", E.A. Lee & D.G. Messerschmitt, pub. 1988 by Kluwer Academic Pub., Boston, Cover sheet, ©Pg, + pp. 289–290, 324–325, 331 and 335–337.

"Seimens Components for Satellite Receiver Units" Databook, published 1993, by Siemens A.G. of Germany; Cover, Table of Contents, ©Pg.+ pp. 7, 18–24, 38–52, 215–217.

Siemens ICs for Entertainment Electronics Data Book published 1990 by Siemens AG of Germany; Cover, first pg., ©Pg + pp. 164–181.

Newnes Guide to Satellite TV Third ED, by DJStephenson, pub. 1991 by Butterworth-Heinemann Ltd, UK, front/back cover, + pp. 84–89 and 268–269.

World Satellite TV & Scrambling Methods—The Technicians Hndbk. 2nd ED. Pub. 1991 by Baylin Pub.; Front & Back cover, First pg., ©Pg, + pp. 12–20 & 141–166.

Philips Semiconductors for TV & Video Systems, TDA 4685 to μA733 Data Handbk. pub. 1992 by Philips Export BV; front & back cover, Table of Contents, +pp. 3525–3535.

*Primary Examiner*—Michael H. Lee
*Assistant Examiner*—Jeffrey S. Murrell
*Attorney, Agent, or Firm*—Joseph S. Tripoli; Peter M. Emanuel

[57] ABSTRACT

A tuner of for a digital satellite television receiver comprises a single conversion stage which produces an IF signal at a low enough frequency to permit a SAW filter to be used to perform symbol shaping as well as the normal IF filtering function. The local oscillator is controlled by a phase locked loop tuning control IC normally used to control the local oscillator of a tuner of a conventional broadcast or cable television receiver. In an exemplary embodiment for tuning RF signals provided by a block converter in the 950 to 1450 mHz frequency range, the IF has a center frequency of 140 mHz.

15 Claims, 3 Drawing Sheets

TUNER FOR DIGITAL SATELLITE RECEIVER

FIELD OF THE INVENTION

The invention concerns a tuner for a satellite receiver, especially one capable of receiving and processing television signals transmitted in digital form.

BACKGROUND OF THE INVENTION

A satellite television receiving system includes an "outdoor unit", including a dish-like receiving antenna and a "block" converter, and an "indoor unit" including a tuner and a signal processing section. The block converter converts the entire range of relatively high frequency RF signals transmitted by the satellite to a more manageable, lower range of frequencies.

In a conventional satellite television receiving system for receiving and processing television information transmitted in analog form, the RF signals transmitted by the satellite are in the C (3.7 to 4.2 gigaHertz) and Ku (11.7 to 14.2.2 gigaHertz) bands, and are converted by the block converter to the L band (900 to 2000 megahertz) as a "block". An RF filter section of the tuner of the indoor unit selects the one of the RF signals provided by the block converter corresponding to the selected channel and the selected RF signal is again converted by a mixer/local oscillator section of the tuner to a lower, intermediate frequency (IF) range for filtering and demodulation. Typically, the IF frequency range has a center frequency of 479 megahertz. Analog satellite television systems typically employ FM modulation, and a baseband video signal is readily obtained from the 479 IF signal by an FM demodulator after filtering by an IF filter. A relatively simple surface acoustic wave (SAW) device can provide adequate filtering.

In newer satellite television systems, such as the DSS™ (Direct Satellite System) available from Thomson Consumer Electronics of Indianapolis, Ind., television information is transmitted in digital form. RF signals are transmitted by the satellite in the Ku band, and are converted by the block converter to the L band. The frequency range of the RF signals transmitted by the satellite is somewhat smaller, e.g., between 12.2 and 12.7 gigaHertz, than that for the analog satellite television system, and the frequency range of RF signals produced by the block converter is accordingly somewhat smaller, e.g., between 950 and 1450 megahertz. As in the analog satellite television receiving systems, the RF signal corresponding to the selected channel has to be reduced in frequency to an IF frequency range for filtering and demodulation. However, the type of filtering ("symbol shaping") required in digital satellite television receiver, cannot readily be performed at the relatively high IF frequency (e.g., 479 megahertz) employed in an analog satellite television receiver, especially using a SAW device. As a result, a relatively expensive digital filter will be required for filtering the demodulated digital signals. Alternatively, the tuner can employ a second conversion stage to convert the relatively high frequency (e.g., 479 megahertz) first IF signal to a second, lower frequency (e.g., less than 100 megahertz) signal for filtering. However, the second conversion stage adds undesirable cost to the receiver.

It is also desirable that the tuner of the digital satellite television receiver be capable of being constructed utilizing components which are already commercially available and therefore relatively inexpensive. Specifically, in this regard it is desirable that the tuner be capable of being constructed utilizing a commercially available integrated circuit (IC) which incorporates a phase locked loop (PLL) for controlling the frequency of the local oscillator. Since a large number of tuner PLL ICs for conventional television receivers which receive and process conventional broadcast and cable television signals are widely available, it is particularly desirable that the tuner of the digital satellite television receiver be capable of being constructed utilizing such a conventional tuner PLL IC.

SUMMARY OF THE INVENTION

In accordance with an aspect of the invention, the tuner of a digital satellite television receiver comprises a single conversion stage for converting the selected RF signal received from the block converter of the outdoor unit to an IF signal within a frequency range which permits the use of a SAW device for "symbol shaping" the IF signal as is required for the transmission of information in digital form. For the reasons to be described below in detail with reference to the exemplary embodiment of the invention, providing for an IF signal having a center frequency in the order of 140 megahertz (mHz) satisfies these requirements. However, different IF frequencies are possible, and, according to another aspect of the invention, in general terms, the IF frequency may be selected to be in the order of the difference between the highest frequency of the RF signal received from the block converter (e.g., 1450 mHZ) and highest local oscillator frequency (1300 mHz) available by utilizing a conventional tuner PLL IC normally utilized in conventional broadcast and cable television receivers.

BRIEF DESCRIPTION OF THE DRAWING

Various aspects of the invention will be described in detail with reference to the accompanying Drawing in which.

DETAILED DESCRIPTION OF THE DRAWING

The invention will be described with reference to a digital satellite television system in which television information is transmitted in encoded and compressed form in accordance with a predetermined digital compression standard, such as MPEG. MPEG is an international standard for the coded representation of moving picture and associated audio information developed by the Motion Pictures Expert Group. The television information is represented by a series or stream of digital signals organized into packets corresponding to respective video and audio portions of the television information. The digital signals are modulated on a RF carrier signal in what is known as QPSK (Quaternary Phase Shift Keying) modulation and the RF signal is transmitted to a satellite in earth orbit, from which it is retransmitted back to the earth. A satellite typically includes a number of transponders for receiving and retransmitting respective modulated RF carriers. The DirecTv™ satellite television transmission system operated by the Hughes Corporation of California is such a digital satellite television transmission system.

Figure 1:
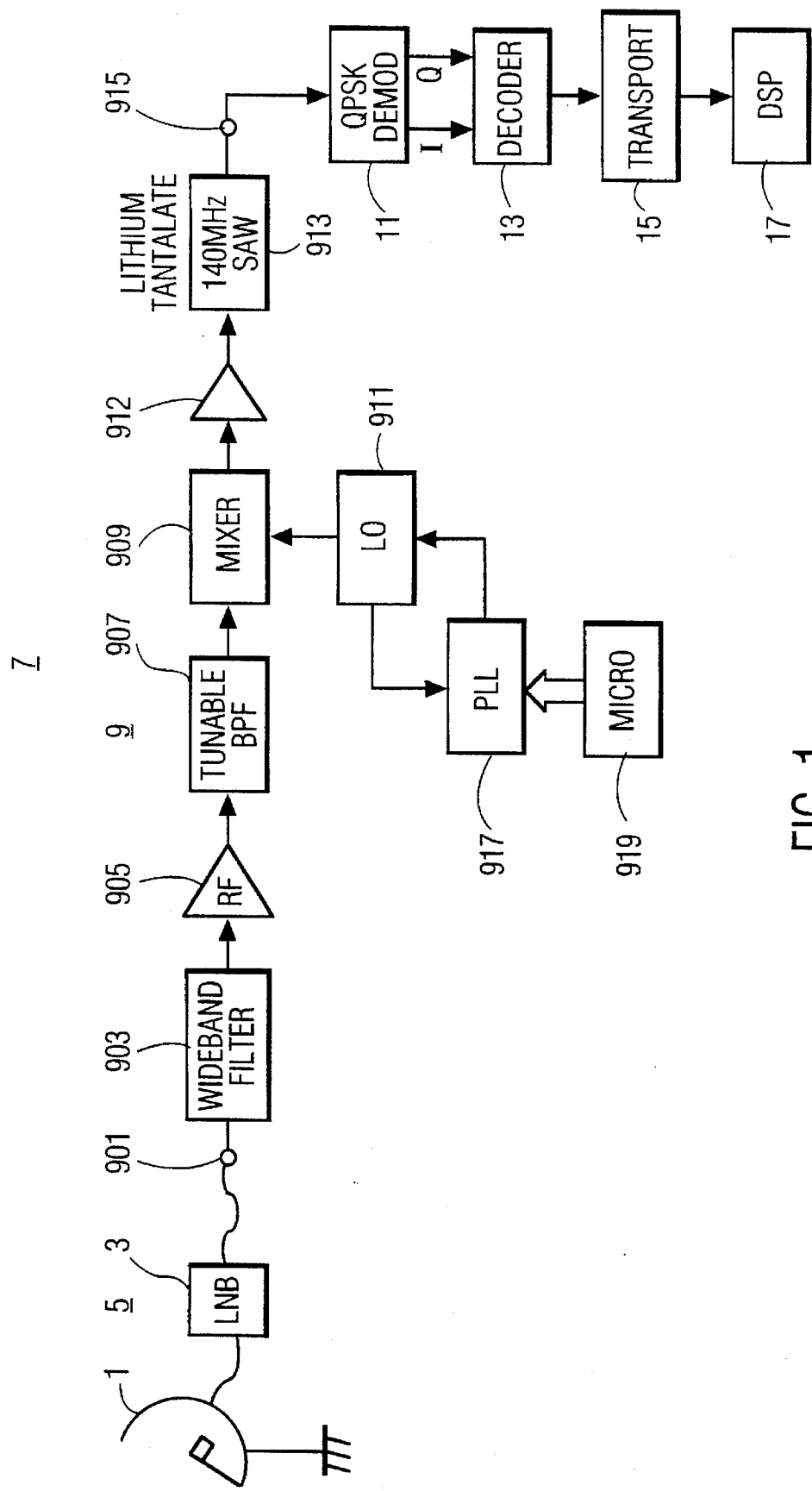
FIG. 1 is a block diagram of a digital satellite television receiving system including a tuner constructed in accordance with an aspect of the invention.

In the digital satellite television receiving system shown in FIG. 1, RF signals modulated with digital signals representing video and audio information are transmitted by a satellite (not shown) and received by a dish-like antenna 1. The relatively high frequency received RF signals (e.g., in the Ku frequency range between 12.2 and 12.7 gigaHertz) are converted by a block converter 3 to relatively a lower frequency RF signals (e.g., in the L band between 950 and 1450 mHz). Block converter 3 includes a low noise amplifier and is therefore often referred to by the initials "LNB". Antenna 1 and LNB 3 are included in a so called "outdoor unit" 5 of the receiving system. The remaining portion of the receiving system is included in a so called "indoor unit" 7.

Indoor unit 7 includes a tuner 9 for selecting the particular RF signal corresponding to the desired channel from the plurality of RF signals received from outdoor unit 5 and for converting the selected RF signal to a lower, intermediate frequency (IF) signal. Tuner 9 is constructed in accordance with the present invention and will be described in detail below.

A QPSK demodulator 11 demodulates the output signal of tuner 9 to produce two analog, quadrature phase digital signals (I and Q). A decoder 13 produces a stream of video and audio packets from the I and Q signals. Decoder 13 includes analog to digital converters for converting the analog I and Q signals to respective series of digital samples and an errors corrector which corrects transmission error based on error codes embed in the transmitted digital signals. The video and audio packets of the digital stream produced by decoder 13 are routed by a transport unit 15 to respective sections of a digital signal processing unit (DSP) 17.

The digital satellite television receiver described so far is similar to the DSS™ satellite television receiver commercially available from Thomson Consumer Electronics, Inc. of Indianapolis, Ind. The present invention is concerned with details of the implementation of tuner 9.

Tuner 9 receives the RF signal provided by LNB 3 at an input 901. The RF input signals are filtered by a wideband filter 903, amplified by an RF amplifier 905, and filtered by a tunable bandpass filter 907. The resultant RF signal is coupled to a first input of a mixer 909. A local oscillator signal produced by a local oscillator (LO) 911 is coupled to a second input of mixer 909. The output of mixer 909 is amplified by an amplifier 912 and coupled to the input of an IF filter 913 comprising a SAW device. The output of IF filter 913 is coupled to output 915 of tuner 9.

Figure 2:
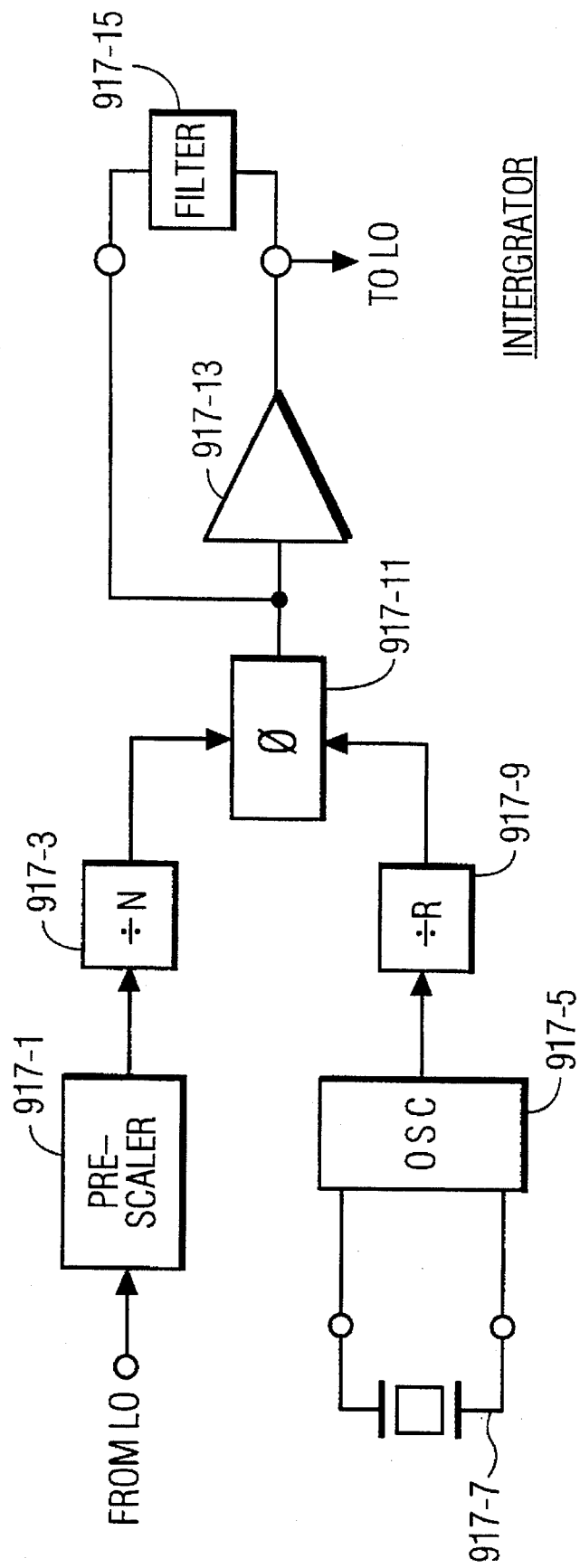
FIG. 2 is a block diagram of a phase locked loop tuning control integrated circuit used in the tuner shown in FIG. 1.

The frequency of local oscillator 911 is controlled by a phase locked loop (PLL) 917 comprising an integrated circuit (IC). The frequency of the LO signal is controlled by the PLL IC in accordance with data generated by a microprocessor 919. As shown in FIG. 2, The PLL IC includes a "prescalar" frequency divider 917-1 for dividing the frequency of the LO signal followed by a programmable frequency divider (÷N) 917-3. The PLL IC also includes an oscillator 917-5, which in combination with an external crystal network 917-7, comprises a reference frequency oscillator. The output of the reference frequency oscillator is coupled to the input of a reference frequency divider (÷R) 917-9. The output signals of programmable divider (÷N) 917-3 and reference divider (÷R) 917-9 are coupled to respective inputs of a phase detector 917-11. The output signal of phase detector 917-11 is coupled to an amplifier 917-13, which together with an external filter network 917-15, comprises an integrator for producing a control voltage for LO 911. When the phase locked loop is locked, the frequency of the LO signal is proportionally related to the frequency of the reference frequency signal produced by reference frequency divider (÷R) 917-9 by the programmable division factor (N) of programmable divider (÷N) 917-3. Programmable division factor N is controlled by data generated by microprocessor 919.

As earlier noted, it is desirable that the tuner have the following three characteristics: (1) include only a single conversion stage; (2) provide an IF signal with a low enough frequency to allow a SAW device to be used for digital symbol shaping as well as normal if filtering, and (3) be capable of being constructed utilizing a PLL tuning control IC conventionally used for broadcast and cable receivers. This is accomplished in the present tuner by selecting the center frequency of the IF signal to be 140 mHz and controlling the frequency of the LO signal to be 140 mHz below the frequency RF signal for the respective channel (transponder). As a result, with a frequency range for RF input signal between 950 and 1450 mHz, the frequency range of the LO signal is between 810 and 1310 mHz. The 140 mHz IF frequency allows a SAW device with the required characteristics, as will be described below, to be used. The 810–1310 mHz frequency range of the LO signal permits a PLL tuning control IC conventionally used for broadcast and cable receivers to be used. Such an IC is the TSA5515T commercially available form Philips Semiconductors and others. It is noted in this regard that the maximum LO frequency available using the TSA5515T and similar ICs is in the order of 1300 mHz, which is adequate.

It will be noted that different IF frequencies are possible, and, in general terms, the IF frequency may be selected to be in the order of the difference between the highest frequency of the RF signal received from the LNB and highest local oscillator frequency available by utilizing a conventional tuner PLL IC normally utilized in conventional broadcast and cable television receivers.

Desirably tunable bandpass filter 907 should remove the image of the desired RF signal which is at a frequency 280 mHz below the frequency of the desired RF signal.

Figure 3:
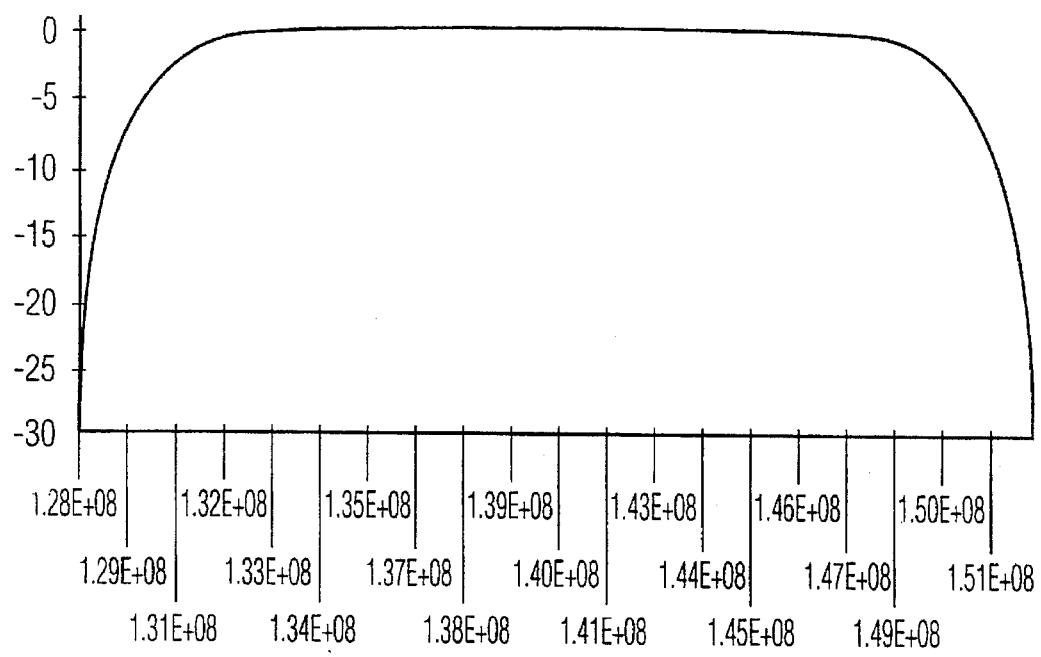
FIG. 3 is an idealized amplitude versus frequency response of a SAW device employed in the tuner shown in FIG. 1.

In a digital transmission system, it is desirable to perform what is known as "symbol shaping" to provide a signal relatively free of intersymbol interference. Such interference may be produced due to improper filtering of high frequency energy of the pulse components of digital signals in the transmitter due to bandwidth limitations. The desired symbol shaping function may be shared between the transmitter and the receiver. In the receiver, it is desirable that the IF filter provide for symbol shaping, as well as the normal IF filtering function, so that a separate digital filter not be required. By way of example, the IF filter may provide what is known in the digital filter arts as a "root raised cosine" response. Such a response in shown in FIG. 3. A SAW device may be used to provide symbol shaping provided that its characteristics are carefully selected.

Two properties of a SAW filter are considered important for application in a tuner of a digital satellite television receiver. These are the: (1) overall shift or offset of the filter 8 characteristic (i.e.,) to the shift of the center frequency) with temperature; and (2) the change of the relative bandwidth (i.e., the passband width divided by the center frequency).

The most common type of SAW device utilizes lithium niobate ($LiNbO_3$) as a substrate. A lithium niobate SAW has a typical temperature coefficient of −90 ppm/degree C. The present tuner employs another type of SAW which utilizes lithium tantalate (LiTaO$_3$) as a substrate. A lithium tantalate SAW has a typical temperature coefficient of −23 ppm/ degree C. Assuming a temperature range of −20 to +70 degree C., and a center frequency of 140 mHz, the following evaluation can be made with regard to frequency shift with temperature:

lithium niobate produces a temperature drift of 140E6×− 90E−6×+/−45=+/−567.0 khz; and lithium tantalate produces a temperature drift of 140E6× −23E−6×+/−45=+/−144.9 khz. and Assuming that a shift of 500 kHz, which may produce a noise margin degradation of slightly less than 0.1 dB is undesirable a lithium niobate SAW exceeds the 500 kHz goal over the range of temperature variation. To use a lithium niobate SAW, the center frequency would have to be reduced to 123 mHz or lower to maintain the 500 kHz goal. With a lithium tantalate SAW, the center frequency has to be 483 mHZ or lower.

As to relative bandwidth, the following is noted. Generally, wider relative bandwidth filters are more difficult to make, and filters with relative bandwidth in excess of 15 to 18% require the use of a lithium niobate SAW. Lesser relative bandwidth requirements allow the use of either type of SAW. A 20 mHz wide filter with a center frequency at 140 mHz has only a relative bandwidth of 14%. If a 18% relative bandwidth were required, an IF center frequency of 110 mHz would be required.

Figure 4:
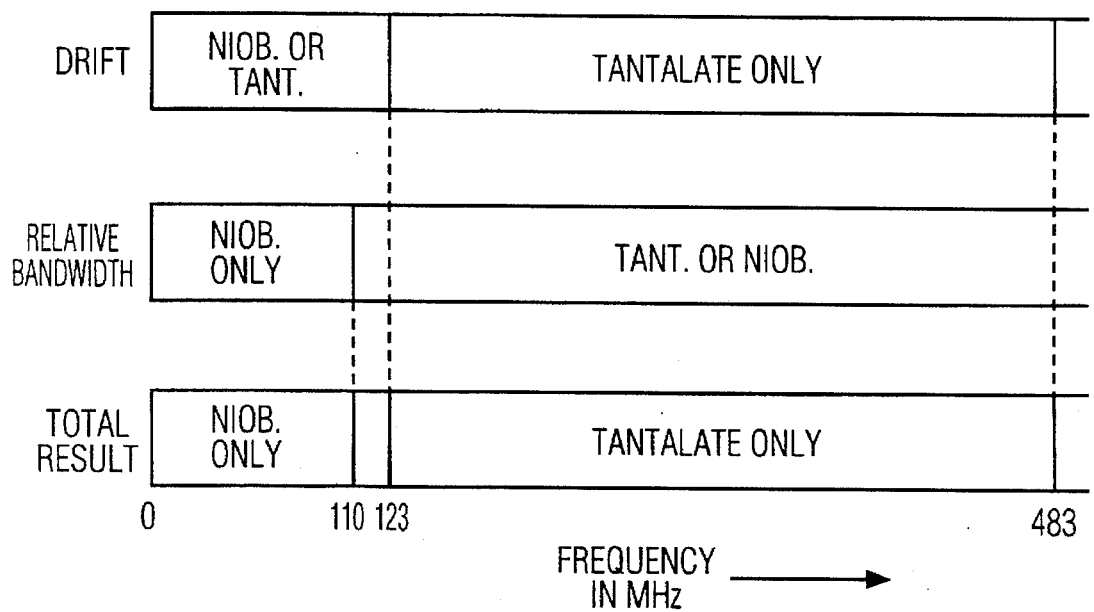
FIG. 4 is graphical representation of certain characteristics of a SAW device as a function of temperature and frequency which are useful in understanding the selection of the particular type of SAW device which is desirably utilized in the tuner shown in FIG. 1.

FIG. 4 graphically summarizes the characteristics discussed above. FIG. 4 shows the frequency regions where a lithium niobate SAW or a lithium tantalate SAW or both may satisfy the temperature drift and relative bandwidth requirements, and the result when both requirements are considered. As can be seen: an IF frequency below 110 mHz requires a lithium niobate SAW filter; an IF between 110 mHz and 123 mHz may utilize either a lithium niobate SAW or a lithium tantalate SAW; an IF between 123 mHz and 483 mHz requires a lithium tantalate SAW, and a SAW for an IF beyond 483 mHz cannot satisfy the requirements due to excessive temperature drift. For a 140 mHz center frequency, a lithium tantalate SAW should be used.

We claim:

1. In a digital satellite television receiver for receiving and processing digital signals modulated on respective ones of a plurality of RF signals received from an outdoor unit including a satellite receiving antenna and a block converter, a tuner comprising:

an RF input for receiving a plurality RF signals provided by said block converter;

a local oscillator for generating a local oscillator signal;

a mixer having a first input coupled to said RF input, a second input coupled to said local oscillator and an output at which an IF signal is produced;

a surface acoustic wave filter coupled to said output of said mixer for filtering said IF signal including intersymbol shaping;

a phase locked loop tuning control integrated circuit for controlling the frequency of said local oscillator; said phase locked loop tuning control integrated circuit being of the type which is normally utilized in conventional terrestrial broadcast and cable television receivers; and wherein the frequency of the IF signal being selected to be in the order of the difference between the highest frequency of the RF signal received from the block converter and highest local oscillator frequency available by utilizing said phase locked loop tuning control integrated circuit.

2. In a digital satellite television receiver for receiving and processing digital signals modulated on respective ones of a plurality of RF signals received from an outdoor unit including a microwave satellite receiving antenna and a block converter, apparatus comprising:

an RF input for receiving said plurality of RF signals provided by said block converter;

a local oscillator in a phase locked loop tuning control integrated circuit for generating a local oscillator signal;

a mixer having a first input coupled to said RE input, a second input coupled to said local oscillator, and an output at which an IF signal is produced;

a surface acoustic wave filter coupled to said output of said mixer for filtering said IF signal; said surface acoustic wave filter being capable of symbol shaping for reducing intersymbol interference; said surface acoustic wave filter having a nominal center frequency greater than 110 mHz and significantly less than 479 mHz; and wherein the frequency of the IF signal being selected to be in the order of the difference between the highest frequency of the RF signal received from the block converter and highest local oscillator frequency available by utilizing said phase locked loop tuning control integrated circuit.

3. In a digital satellite television receiver for receiving and processing digital signals modulated on respective ones of a plurality of RF signals received from an outdoor unit including a satellite receiving antenna and a block converter, a tuner comprising:

an RF input for receiving a plurality RF signals provided by said block converter;

a local oscillator for generating a local oscillator signal;

a mixer having a first input coupled to said RF input, a second input coupled to said local oscillator and an output at which an IF signal is produced;

a surface acoustic wave filter coupled to said output of said mixer for filtering said IF signal including intersymbol shaping; and a phase locked loop tuning control integrated circuit for controlling the frequency of said local oscillator; said phase locked loop tuning control integrated circuit being of the type which is normally utilized in conventional terrestrial broadcast and cable television receivers;

the frequency of the IF signal being selected to be in the order of the difference between the highest frequency of the RF signal received from the block converter and highest local oscillator frequency available by utilizing said phase locked loop tuning control IC.

4. The apparatus recited in claim 3, wherein:

said block converter provides RF signals in a frequency range in the order of 950 to 1450 mHz and said local oscillator has a frequency range in the order of 810 to 1310 mHz.

5. The apparatus recited in claim 4, wherein:

said nominal frequency of said signal is 140 mHz.

6. The apparatus recited in claim 13, wherein:

said local oscillator is included in a phase locked loop for controlling the frequency of said local oscillator.

7. The apparatus recited in claim 6, wherein:

said phase locked loop includes a phase locked loop tuning control integrated circuit of the type which is normally utilized in conventional terrestrial broadcast and cable television receivers.

8. In a digital satellite television receiver for receiving and processing digital signals modulated on respective ones of a plurality of RF signals received from an outdoor unit including a satellite receiving antenna and a block converter, a tuner comprising:

an RF input for receiving a plurality RF signals provided by said block converter;

a local oscillator for generating a local oscillator signal;

a mixer having a first input coupled to said RF input, a second input coupled to said local oscillator and an output at which an IF signal is produced;

a surface acoustic wave filter coupled to said output of said mixer for filtering said IF signal including intersymbol shaping; a phase locked loop tuning control integrated circuit for controlling the frequency of said local oscillator; said phase locked loop tuning control integrated circuit being of the type which is normally utilized in conventional terrestrial broadcast and cable television receivers; and wherein:

the frequency of the IF signal is selected to be in the order of the difference between the highest frequency of said RF signals received from said block converter and the highest local oscillator frequency available by utilizing said phase locked loop tuning control integrated circuit.

9. The apparatus recited in claim 8, wherein:

said block converter provides RF signals in a frequency range in the order of 950 to 1450 mHz and said local oscillator has a frequency range in the order of 810 to 1310 mHz.

10. The apparatus recited in claim 9, wherein:

said IF signal has a nominal frequency of 140 mHz.

11. In a digital satellite television receiver for receiving and processing digital signals modulated on respective ones of a plurality of RF signals received from an outdoor unit including a microwave satellite receiving antenna and a block converter, apparatus comprising:

an RF input for receiving said plurality of RF signals provided by said block converter;

a local oscillator for generating a local oscillator signal;

a mixer having a first input coupled to said RF input, a second input coupled to said local oscillator, and an output at which an IF signal is produced;

a surface acoustic wave filter coupled to said output of said mixer for filtering said IF signal; said surface acoustic wave filter being capable of symbol shaping for reducing intersymbol interference; said surface acoustic wave filter having a nominal center frequency greater than 110 mHz and significantly less than 479 mHz; and wherein:

said block converter provides RF signals in a frequency range in the order of 950 to 1450 mHz and said local oscillator has a frequency range in the order of 810 to 1310 mHz.

12. The apparatus recited in claim 11, wherein:

said nominal center frequency of said surface acoustic wave surface filter is 140 mHz.

13. In a digital satellite television receiver for receiving and processing digital signals modulated on respective ones of a plurality of RF signals received from an outdoor unit including a microwave satellite receiving antenna and a block converter, apparatus comprising:

an RF input for receiving said plurality of RF signals provided by said block converter;

a local oscillator in a phase locked loop for generating a local oscillator signal, said phase locked loop including a phase locked loop tuning control integrated circuit of a type which is normally utilized in conventional terrestrial broadcast and cable television receivers;

a mixer having a first input coupled to said RF input, a second input coupled to said local oscillator, and an output at which an IF signal is produced;

a surface acoustic wave filter coupled to said output of said mixer for filtering said IF signal; said surface acoustic wave filter being capable of symbol shaping for reducing intersymbol interference; said surface acoustic wave filter having a nominal center frequency greater than 110 mHz and significantly less than 479 mHz; and wherein:

the frequency of the IF signal is selected to be in the order of the difference between the highest frequency of said RF signals received from said block converter and the highest local oscillator frequency available by utilizing said phase locked loop tuning control integrated circuit.

14. The apparatus recited in claim 13, wherein:

said block converter provides RF signals in a frequency range in the order of 950 to 1450 mHz and said local oscillator has a frequency range in the order of 810 to 1310 mHz.

15. The apparatus recited in claim 3, wherein: said nominal frequency of said signal is 140 mHz.

* * * * *